United States Patent
Jung

(10) Patent No.: US 8,466,467 B2
(45) Date of Patent: Jun. 18, 2013

(54) ORGANIC LIGHT-EMITTING DISPLAY APPARATUS AND METHOD OF MANUFACTURING THE SAME

(75) Inventor: In-Young Jung, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 167 days.

(21) Appl. No.: 13/095,666

(22) Filed: Apr. 27, 2011

(65) Prior Publication Data
US 2012/0132916 A1    May 31, 2012

(30) Foreign Application Priority Data
Nov. 25, 2010  (KR) ......................... 10-2010-0118081

(51) Int. Cl.
*H01L 27/32* (2006.01)
(52) U.S. Cl.
USPC .......... 257/59; 257/71; 257/72; 257/E33.001; 257/E27.001; 438/34; 438/23; 438/29; 438/99; 438/142; 438/149; 438/151; 438/197; 438/239; 438/250; 438/253
(58) Field of Classification Search
None
See application file for complete search history.

(56) References Cited

U.S. PATENT DOCUMENTS

| 2005/0012455 | A1 | 1/2005 | Lee et al. |
| 2005/0263765 | A1* | 12/2005 | Maekawa ........................ 257/69 |
| 2006/0175966 | A1 | 8/2006 | Yamada et al. |
| 2006/0208230 | A1 | 9/2006 | Cho et al. |

FOREIGN PATENT DOCUMENTS

| JP | 2003-100209 A | 4/2003 |
| JP | 2004-231982 A | 8/2004 |
| KR | 2001-0101640 A | 11/2001 |
| KR | 10-2005-0010332 A | 1/2005 |
| KR | 10-2006-0100792 A | 9/2006 |
| KR | 10-2008-0012791 A | 2/2008 |

* cited by examiner

*Primary Examiner* — Fei Fei Yeung Lopez
(74) *Attorney, Agent, or Firm* — Robert E. Bushnell, Esq.

(57) ABSTRACT

An organic light-emitting display apparatus includes: an active layer formed on the substrate; a gate electrode, in which a first insulation layer formed on the active layer, a first conductive layer formed on the first insulation layer and comprising a transparent conductive material, and a second conductive layer comprising a metal are sequentially stacked; a pixel electrode, in which a first electrode layer formed on the first insulation layer to be spaced apart from the gate electrode and comprising a transparent conductive material, a second electrode layer formed of a semi-permeable metal and comprising pores, and a third electrode layer comprising a metal are sequentially stacked; source/drain electrodes electrically connected to the active layer with a second insulation layer covering the gate electrode and the pixel electrode interposed therebetween; an electro-luminescence (EL) layer formed on the pixel electrode; and an opposite electrode formed on the EL layer to face the pixel electrode, wherein the second electrode layer comprises nano-sized silver (Ag) particles.

18 Claims, 8 Drawing Sheets

ORGANIC LIGHT-EMITTING DISPLAY APPARATUS AND METHOD OF MANUFACTURING THE SAME

CLAIM OF PRIORITY

This application makes reference to, incorporates the same herein, and claims all benefits accruing under 35 U.S.C §119 from an application earlier filed in the Korean Intellectual Property Office on 25 Nov. 2010, and there duly assigned Serial No. 10-2010-0118081 by that Office.

BACKGROUND OF THE INVENTION

1. Field of the Invention

The present invention relates to an organic light-emitting display apparatus and a method of manufacturing the same.

2. Description of the Related Art

Organic light-emitting display apparatuses are manufactured by forming a plurality of conductive layers and then being patterned to include a thin film transistor, a capacitor, a pixel electrode, and wiring connecting thereto. In particular, a functional layer that realizes an optical resonance structure may be further included in a pixel electrode. In general, such a functional layer is formed of a semi-permeable metal by using deposition.

However, when the functional layer is formed by deposition, high-priced deposition equipment is required and a patterning process is essential through etching after the deposition. Also, the functional layer formed of a semi-permeable metal may corrode and be damaged during patterning through etching. Also, as silver atoms are densely arranged in the functional layer formed by deposition, the functional layer has low light transmittance and thus optical extraction efficiency of the functional layer decreases. In addition, when the functional layer is formed by deposition, a light scattering function of the functional layer is deteriorated and thus a separate structure for light scattering, such as a polarizer, is required.

SUMMARY OF THE INVENTION

The present invention provides an organic light-emitting display apparatus including a functional layer formed of a semi-permeable metal included in a pixel electrode by using an inkjet method, wherein the functional layer includes pores for improving optical efficiency of the functional layer, and a method of manufacturing the organic light-emitting display apparatus.

According to an aspect of the present invention, there is provided an organic light-emitting display apparatus including: an active layer formed on the substrate; a gate electrode, in which a first insulation layer formed on the active layer, a first conductive layer formed on the first insulation layer, and including a transparent conductive material, and a second conductive layer including a metal are sequentially stacked; a pixel electrode, in which a first electrode layer formed on the first insulation layer to be spaced apart from the gate electrode and including a transparent conductive material, a second electrode layer formed of a semi-permeable metal and including pores, and a third electrode layer including a metal are sequentially stacked; source/drain electrodes electrically connected to the active layer, with a second insulation layer covering the gate electrode and the pixel electrode interposed therebetween; an electro-luminescence (EL) layer formed on the pixel electrode; and an opposite electrode formed on the EL layer to face the pixel electrode.

The second electrode layer may include nano-sized silver (Ag) particles.

The second electrode layer may be formed by using inkjet printing.

The first insulation layer and the first conductive layer may be formed on the same level at the same time.

The first conductive layer and the first electrode layer may each include at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The second conductive layer and the third electrode layer may each include at least one metal selected from the group consisting of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu).

The second electrode layer may contact the EL layer.

The third electrode layer may include a first opening so as to expose the second electrode layer disposed below the third electrode layer.

The third electrode layer may be electrically connected to any one of the source/drain electrodes.

The second insulation layer may include a second opening that corresponds to the first opening.

The organic light-emitting display apparatus may further include a pixel-defining layer formed on the source/drain electrodes, wherein the pixel-defining layer includes a third opening that connects to the first opening and the second opening or is formed corresponding to the first opening and the second opening, and the EL layer contacts the second electrode layer through the third opening.

The organic light-emitting display apparatus may further include: a capacitor lower electrode formed on the same level as the active layer to be spaced apart from the active layer; and a capacitor upper electrode insulated from the capacitor lower electrode by the first insulation layer and formed on the same level as the gate electrode to correspond to the capacitor lower electrode.

The capacitor upper electrode may be formed on the first insulation layer and include a transparent conductive material.

According to another aspect of the present invention, there is provided a method of manufacturing an organic light-emitting display apparatus, the method including: forming an active layer on the substrate; forming a pixel electrode and a gate electrode by sequentially forming a first insulation layer, a first transparent conductive layer, and a first metal layer on the active layer and by patterning the first transparent conductive layer and the first metal layer; forming an opening that exposes the pixel electrode by forming a second insulation layer on the pixel electrode and the gate electrode and by patterning the second insulation layer, and forming a contact hole that exposes the active layer; forming source/drain electrodes that contact the active layer through the contact hole by forming the second metal layer on the exposed pixel electrode and the contact hole and patterning the second metal layer, and removing a portion of the first metal layer of the pixel electrode; and exposing the pixel electrode by forming a pixel-defining layer on the source/drain electrodes and patterning the pixel-defining layer, wherein the forming of the pixel electrode and the gate electrode further includes forming a semi-permeable metal layer between the first transparent conductive layer and the first metal layer where the pixel electrode is to be formed by using inkjet printing, and the semi-permeable metal layer includes nano-sized silver (Ag) particles and pores.

The method may further include: after the exposing of the pixel electrode, forming an electro-luminescence (EL) layer on the exposed pixel electrode and forming an opposite electrode to cover the EL layer.

The forming of the source and drain electrodes and the removing a portion of the first metal layer may include: removing a portion of the first metal layer of the pixel electrode and exposing the semi-permeable metal layer, wherein the EL layer directly contacts the exposed semi-permeable metal layer.

Any one of the source and drain electrodes may be electrically connected to the pixel electrode.

The forming of the active layer on the substrate may further include: forming a capacitor lower electrode on the same level as the active layer to be spaced apart from the active layer.

The forming of the pixel electrode and the gate electrode may further include: forming a capacitor upper electrode to correspond to the capacitor lower electrode by patterning the first transparent conductive layer and the first metal layer.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
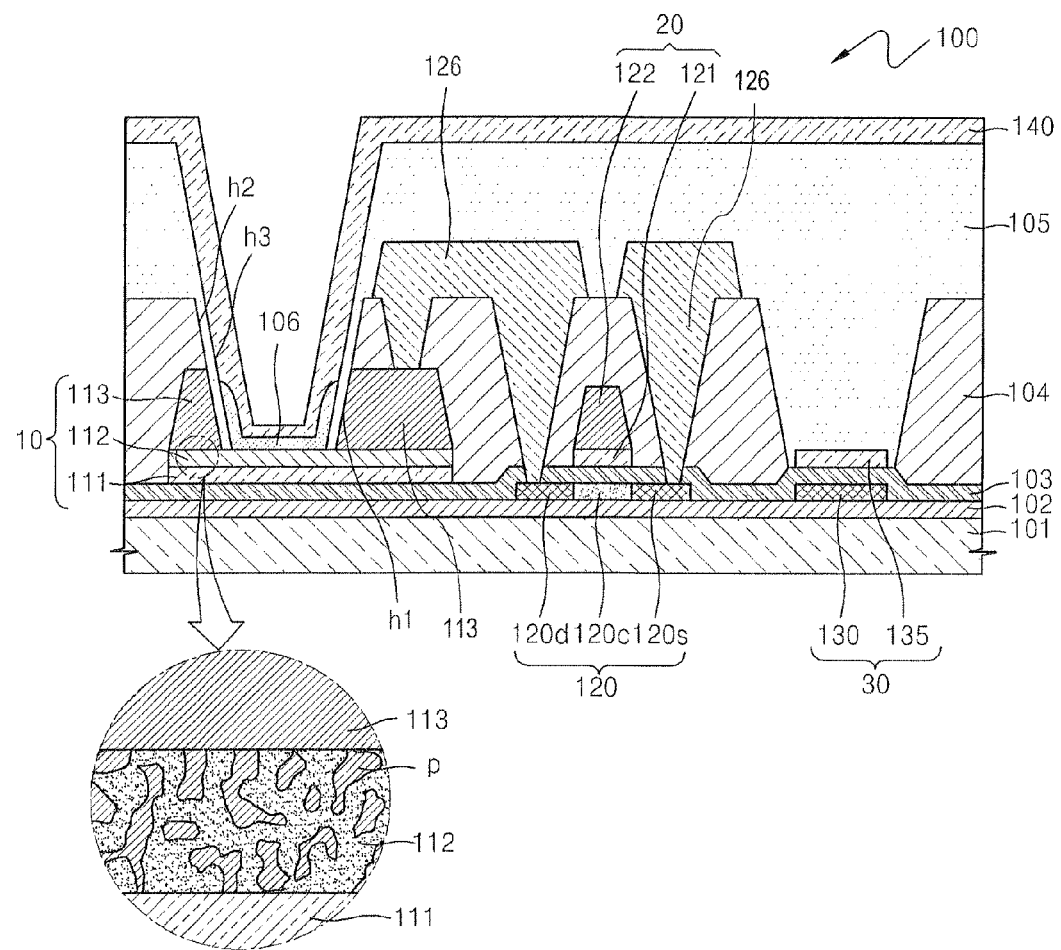
FIG. 1 is a cross-sectional view of an organic light-emitting display apparatus according to an embodiment of the present invention.

While exemplary embodiments are capable of various modifications and alternative forms, embodiments thereof are shown by way of exemplary in the drawings and will herein be described in detail. It should be understood, however, that there is no intent to limit exemplary embodiments to the particular forms disclosed, but on the contrary, exemplary embodiments are to cover all modifications, equivalents, and alternatives falling within the scope of the invention. In the description, the detailed descriptions of well-known technologies and structures may be omitted so as not to hinder the understanding of the present invention.

It will be understood that, although the terms 'first', 'second', 'third', etc., may be used herein to describe various elements, these elements should not be limited by these terms. These terms are only used to distinguish one element from another element.

The terminology used herein is for the purpose of describing particular embodiments only and is not intended to be limiting of exemplary embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Hereinafter, one or more embodiments of the present invention are described more fully with reference to the accompanying drawings.

FIG. 1 is a cross-sectional view of an organic light-emitting display apparatus 100 according to an embodiment of the present invention.

The organic light-emitting display apparatus 100 according to the current embodiment of the present invention includes a substrate 101, an active layer 120, a gate electrode 20, a pixel electrode 10, source/drain electrodes 126, a capacitor 30, an electro-luminescence (EL) layer 106, and an opposite electrode 140.

The substrate 101 may be formed of a transparent glass material mainly including SiO2. However, the substrate 101 is not limited thereto and may be formed of a transparent plastic material. Examples of the transparent plastic material may be an insulating organic material selected from the group consisting of polyethersulphone (PES); polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), and cellulose acetate propionate (CAP).

In a bottom emission type display apparatus where an image is realized toward the substrate 101, the substrate 101 needs to be formed of a transparent material. However, in a top emission type display apparatus where an image is realized opposite to the substrate 101, the substrate 101 may not be formed of a transparent material. In this case, the substrate 101 may be formed of a metal. When the substrate 101 is formed of a metal, the substrate 101 may include, but is not limited to, at least one selected from the group consisting of carbon, iron, chrome, manganese, nickel, titanium, molybdenum, stainless steel (SUS), an Invar alloy, an Inconel alloy, and a Kovar alloy. The substrate 101 may be formed of a metal foil.

In order to form a smooth surface on the substrate 101 and to prevent impurities from penetrating into the substrate 101, a buffer layer 102 may be formed on the substrate 101. The buffer layer 102 may include $SiO_2$ and/or SiNx. The buffer layer 102 may be deposited by using a deposition method such as plasma-enhanced chemical vapor deposition (PECVD), atmospheric pressure CVD (APCVD), or low pressure CVD (LPCVD).

The active layer 120 having a predetermined pattern is formed on the buffer layer 102. The active layer 120 may be formed of an inorganic semiconductor, such as amorphous silicon or polysilicon, or an organic semiconductor and may include a source area 120s, a drain area 120d, and a channel area 120c. The source area 120s and the drain area 120d may be formed by doping the active layer 120, formed of amorphous silicon or polysilicon, with impurities. When the active layer 120 is doped with a group III element, such as boron (B), and a group V element, such as nitrogen (N), a p-type semiconductor and an n-type semiconductor may be formed, respectively.

Also, a capacitor lower electrode 130 may be formed on the buffer layer 102 so as to be spaced apart from the active layer 120. That is, the active layer 120 and the capacitor lower electrode 130 are formed on the same level. The capacitor lower electrode 130 may be formed of an inorganic semiconductor, such as amorphous silicon or polysilicon, or an organic semiconductor.

A first insulation layer 103 is formed on the active layer 120 and the capacitor lower electrode 130. The first insulation layer 103 is used to insulate the active layer 120 from the gate electrode 20 or the capacitor lower electrode 130 from a capacitor upper electrode 135, and may be formed by depositing an organic material or an inorganic material, such as SiNx or $SiO_2$, by using PECVD, APCVD, or LPCVD.

The gate electrode 20 is formed on the first insulation layer 103. The gate electrode 20 according to the current embodiment of the present invention may have a structure in which a first conductive layer 121 and a second conductive layer 122 are sequentially formed. More specifically, the gate electrode 20 may include the first conductive layer 121 and the second conductive layer 122 including a transparent conductive material and a metal, respectively.

The first conductive layer 121 is formed on the first insulation layer 103 and improves an adhesive property between the first insulation layer 103 and the second conductive layer 122. The first conductive layer 121 may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The second conductive layer 122 is formed on the first conductive layer 121 and functions as a wiring via which an electric signal is transmitted. The second conductive layer 122 may be formed as a single layer or a multi-layer structure including at least one metal selected from the group consisting of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu). For example, the second conductive layer 122 may include a first layer including molybdenum (Mo), a second layer, including aluminum (Al), formed on the first layer, and a third layer, including molybdenum (Mo), formed on the second layer. When the second conductive layer 122 is formed of Mo/Al/Mo, aluminum (Al) functions as a wiring or an electrode, and molybdenum (Mo) functions as a barrier layer.

The pixel electrode 10 is also formed on the first insulation layer 103 so as to be spaced apart from the gate electrode 20. The pixel electrode 10 according to the current embodiment of the present invention has a structure different from the gate electrode 20. The pixel electrode 10 is formed on the first insulation layer 103 and may include a first electrode layer 111 including a transparent conductive layer, a second electrode layer 112 formed of a semi-permeable metal including pores p, and a third electrode layer 113 including a metal, wherein the first electrode layer 111, the second electrode layer 112, and the third electrode layer 113 may be sequentially stacked.

The first electrode layer 111 is formed at the same time as the first conductive layer 121. The first electrode layer 111, along with the opposite electrode 140, apply electricity to the EL layer 106. The first electrode layer 111 may include at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The second electrode layer 112 may function as a metal mirror that partially transmits or reflects light. That is, the second electrode layer 112 may be used as a half mirror of an organic light-emitting display apparatus which employs an optical resonance structure. The second electrode layer 112 is formed of a semi-permeable metal including the pores p. The second electrode layer 112 may include at least one metal selected from the group consisting of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu). More specifically, the second electrode layer 112 may include silver (Ag) including nano-sized particles.

The third electrode layer 113 is formed simultaneously with the second conductive layer 122. The third electrode layer 113 may be formed of the same material as the second conductive layer 122 and may be formed as a single layer or a multi-layer structure including at least one metal selected from the group consisting of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu). According to an embodiment of the present invention, the third electrode layer 113 may include a first opening h1 that exposes the second electrode layer 112 disposed below the third electrode layer 113. Also, the third electrode layer 113 is electrically connected to any one of the source/drain electrodes 126 and may transmit an electric signal from a thin film transistor to the pixel electrode 10.

Also, the capacitor upper electrode 135 may be formed on the first insulation layer 103 to correspond to the capacitor lower electrode 130. The capacitor upper electrode 135 may be formed at the same time as the gate electrode 20 and the pixel electrode 10. The capacitor upper electrode 135 may be formed of the same material and have the same structure as the first conductive layer 121 of the gate electrode 20.

Accordingly, the capacitor upper electrode 135 may correspond to the first conductive layer 121 of the gate electrode 20 and include a transparent conductive material. The type and characteristic of the transparent conductive material are described above in relation to the gate electrode 20 and thus description thereof is not repeated.

The capacitor 30 includes the capacitor lower electrode 130 and the capacitor upper electrode 135 with the first insulation layer 103 interposed therebetween. Here, the capacitor lower electrode 130 is formed on the same level as the active layer 120 and the capacitor upper electrode 135 is formed on the same level as the first conductive layer 121 of gate electrode 20. Thus, a thickness of the organic light-emitting display apparatus 100 is efficiently reduced.

Second insulation layers 104 are formed on the gate electrode 20, the pixel electrode 10, and the first insulation layer 103 on either side of the capacitor upper electrode 135. The second insulation layers 104 may be used to planarize a thin film transistor area including the gate electrode 20, an area including the pixel electrode 10, and an area including the capacitor 30, and insulate the gate electrode 20 from the source/drain electrodes 126. The second insulation layer 104 may be formed of various insulation materials. For example, the second insulation layer 104 may include an inorganic material, such as an oxide and a nitride, or an organic material. An inorganic insulation layer forming the second insulation layer 104 may include $SiO_2$ (Silicon Dioxide), SiNx (Silicon Nitride), SiON (Silicon Oxynitride), $Al_2O_3$ (Aluminum Oxide), $TiO_2$ (Titanium Dioxide), $Ta_2O_5$ (Tantalum Pentoxide), $HfO_2$ (Hafnium Oxide), $ZrO_2$ (Zirconium Dioxide), BST (Barium Strontium Titanate), or PZT (Plumbum Zirconate-Titanate), and an organic insulation layer forming the second insulation layer 104 may include a general purpose polymer such as PMMA (polymethylmethacrylate) or PS (polystyrene), a polymer derivative including a phenol group, an acrylic polymer, an imide-based polymer, an arylether-based polymer, an amide-base polymer, a fluorine-based polymer, a p-xylene-based polymer, a vinylalcohol-based polymer, and blends thereof. The second insulation layer 104 may be formed as a complex stack body including an inorganic insulation layer and an organic insulation layer. The second insulation layer 104 is formed by using spin coating.

The second insulation layer 104 includes a second opening h2 that corresponds to the first opening h1. The first opening h1 may be exposed through the second opening h2. Also, the second insulation layer 104 includes a contact hole that exposes the source area 120s and the drain area 120d of the active layer 120. The source/drain electrodes 126 may be formed to be close to the source and drain areas 120s and 120d of the active layer 120, respectively, through the contact hole. Also, one of the source/drain electrodes 126 is connected to the pixel electrode 10. More specifically, one of the source/drain electrodes 126 is electrically connected to the third electrode layer 113 of the pixel electrode 10.

The source/drain electrodes 126 are formed by patterning a metal layer. The metal layer may have a multi-layer structure. For example, the source/drain electrodes 126 may be formed as a single layer or a multi-layer structure including at least one metal selected from the group consisting of aluminum (Al), platinum (Pt), palladium (Pd), silver (Ag), magnesium (Mg), gold (Au), nickel (Ni), neodymium (Nd), iridium (Ir), chrome (Cr), lithium (Li), (Ca), molybdenum (Mo), titanium (Ti), tungsten (W), and copper (Cu).

A pixel-defining layer 105 is formed on the source/drain electrodes 126. The pixel-defining layer 105 may be formed of an organic material or an inorganic material. The pixel-defining layer 105 includes a third opening h3. The third opening h3 may connect to the first opening h1 and the second opening h2 or may be formed corresponding to the first opening h1 and the second opening h2. The second electrode layer 112 of the pixel electrode 10 is exposed through the third opening h3.

The EL layer 106 is formed contacting the second electrode layer 112 of the pixel electrode 10 exposed through the third opening h3. The EL layer 106 emits light due to electric driving of the opposite electrode 140. An emission layer (EML) included in the EL layer 106 may be formed of a low molecular weight or polymer organic material. When the emission layer is formed of a low molecular weight organic material, the EL layer 106 may include a hole injection layer (HIL), a hole transport layer (HTL), the emission layer, an electron transport layer (ETL) and an electron injection layer (EIL). In addition, various other layers may be stacked in the EL layer 106, if necessary. An organic material used to form the emission layer may include copper phthalocyanine (CuPc), N,N'-Di(naphthalene-1-yl)-N,N'-diphenyl-benzidine (NPB), or tris-8-hydroxyquinoline aluminum) (Alq3). When the emission layer is formed of a polymer organic material, the EL layer 106 may include a hole transport layer, in addition to the emission layer. The hole transport layer may include poly-(2,4)-ethylene-dihydroxy thiophene (PEDOT) or polyaniline (PANI). An organic material used to form the hole transport layer may include a polymer organic material, such as poly-phenylene vinylene (PPV) and polyfluorene. The EL layer 106 may be formed on the pixel electrode 10 by using inkjet printing or spin coating.

The opposite electrode 140 is formed on the pixel-defining layer 105 and the EL layer 106. The opposite electrode 140 is disposed facing the pixel electrode 10 with the EL layer 106 interposed therebetween. The opposite electrode 140 may be formed by depositing a metal having a small work function, such as silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), and compounds thereof, and then depositing a transparent conductive material, such as ITO, IZO, ZnO, or $In_2O_3$, on the deposited metal.

A sealing member (not illustrated) may be formed on the opposite electrode 140. The sealing member is formed of a transparent material to protect the EL layer 106 and other layers from external moisture or oxygen. In this regard, the sealing member may include glass, plastic, or a structure in which an organic material and an inorganic material overlap each other.

FIGS. 2 through 10 are cross-sectional views schematically illustrating a method of manufacturing the organic light-emitting display apparatus 100, according to an embodiment of the present invention.

Figure 2:
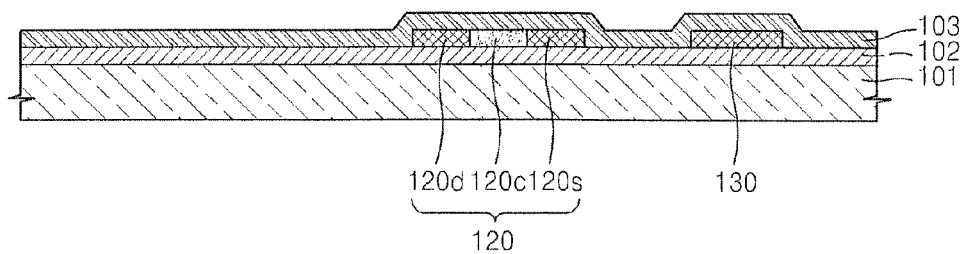
FIGS. 2 through 10 are cross-sectional views schematically illustrating a method of manufacturing an organic light-emitting display apparatus, according to an embodiment of the present invention.

Referring to FIG. 2, the substrate 101 is prepared and then the buffer layer 102, which planarizes the substrate 101 and prevents moisture and foreign substances from penetrating into the substrate, is formed on the substrate 101. The active layer 120 is formed on the buffer layer 102, and the capacitor lower electrode 130 is formed on the same level as the active layer 120 to be spaced apart from the active layer 120. The active layer 120 and the capacitor lower electrode 130 are simultaneously formed by using photolithography using one mask. The first insulation layer 103 is formed on the active layer 120 and the capacitor lower electrode 130.

Then, the gate electrode 20, the pixel electrode 10, and the capacitor upper electrode 135 are formed on the first insulation layer 103, as described with reference to FIGS. 3 through 5 as follows.

Figure 3:
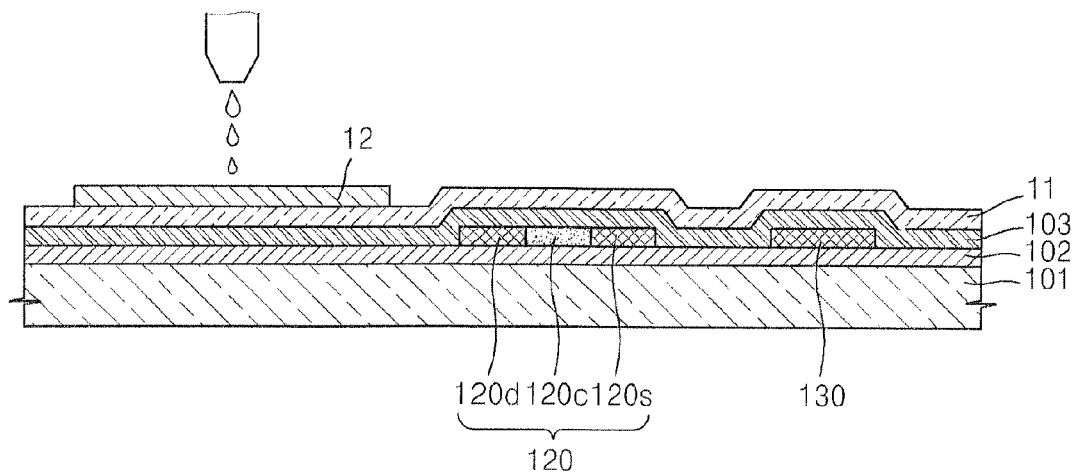

Referring to FIG. 3, a first transparent conductive layer 11 is formed on the first insulation layer 103. Then, a semi-permeable metal layer 12 is formed on an area of the first transparent conductive layer 11, on which the pixel electrode 10 is only to be formed, by using inkjet printing. In inkjet printing, a liquefied material is supplied through a nozzle. A liquefied material used to form the semi-permeable metal layer 12 is formed by mixing semi-permeable metal particles to a volatile solvent. Here, the semi-permeable metal particle may be silver (Ag) having nano-sized particles. When such a liquefied material is supplied through a nozzle and is dried, the semi-permeable metal layer 12 includes pores p, the pores p remaining at a place where a volatile solvent evaporates. The semi-permeable metal layer 12 becomes the second electrode layer 112 of the pixel electrode 10. A structure and function of the second electrode layer 112 is described below in detail with reference to FIG. 11.

Figure 4:
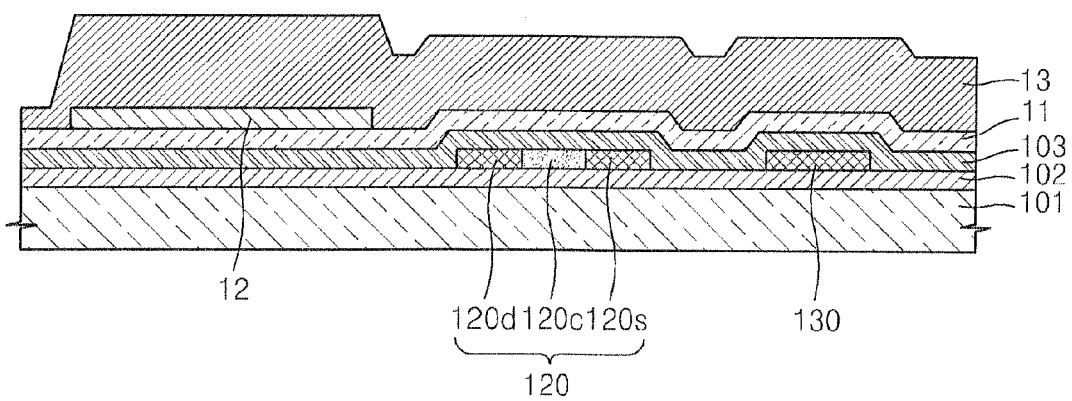

Referring to FIG. 4, a first metal layer 13 is formed on the first transparent conductive layer 11 and the semi-permeable metal layer 12.

Figure 5:
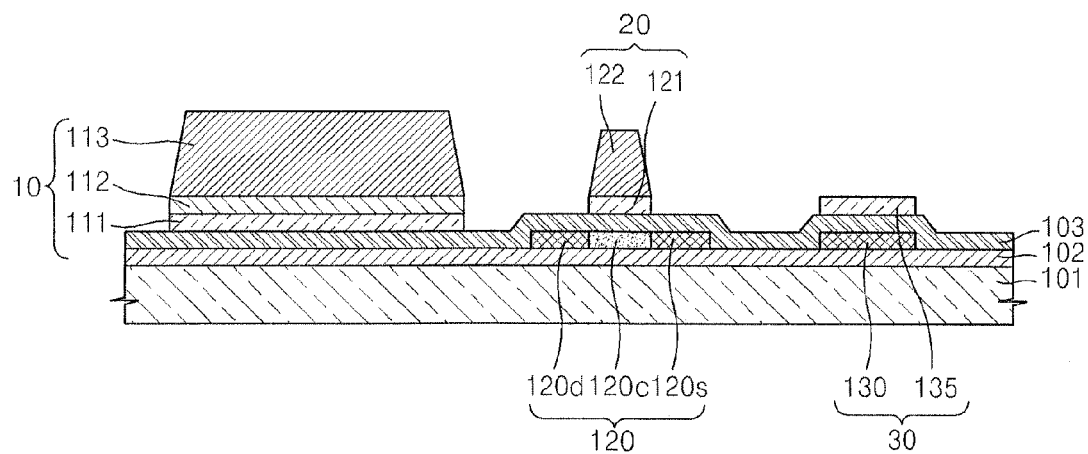

Referring to FIG. 5, the structure formed in FIG. 4 is patterned to form the pixel electrode 10, the gate electrode 20, and the capacitor upper electrode 135. Accordingly, the pixel electrode 10 according to an embodiment of the present invention includes the first electrode layer 111 corresponding to the first transparent conductive layer 11, the second electrode layer 112 corresponding to the semi-permeable metal layer 12, and the third electrode layer 113 corresponding to the first metal layer 13. Also, the gate electrode 20 includes the first conductive layer 121 corresponding to the first transparent conductive layer 11, and the second conductive layer 122 corresponding to the first metal layer 13.

The capacitor upper electrode 135 is formed on the same level as the first conductive layer 121 of the gate electrode 20 to correspond to the capacitor lower electrode 130. In particular, the capacitor upper electrode 135 may be patterned to only include a layer corresponding to the first transparent conductive layer 11 using a halftone mask. As described above, the gate electrode 20, the pixel electrode 10, and the capacitor upper electrode 135 may be formed through photolithography using one mask. However, the present invention is not limited thereto, and the capacitor upper electrode 135 may firstly include a first upper layer corresponding to the first transparent conductive layer 11 and a second upper layer corresponding to the first metal layer 13. Then, the second upper layer disposed uppermost may be etched so that the capacitor upper electrode 135 may finally include only one layer corresponding to the first transparent conductive layer 11.

Figure 6:
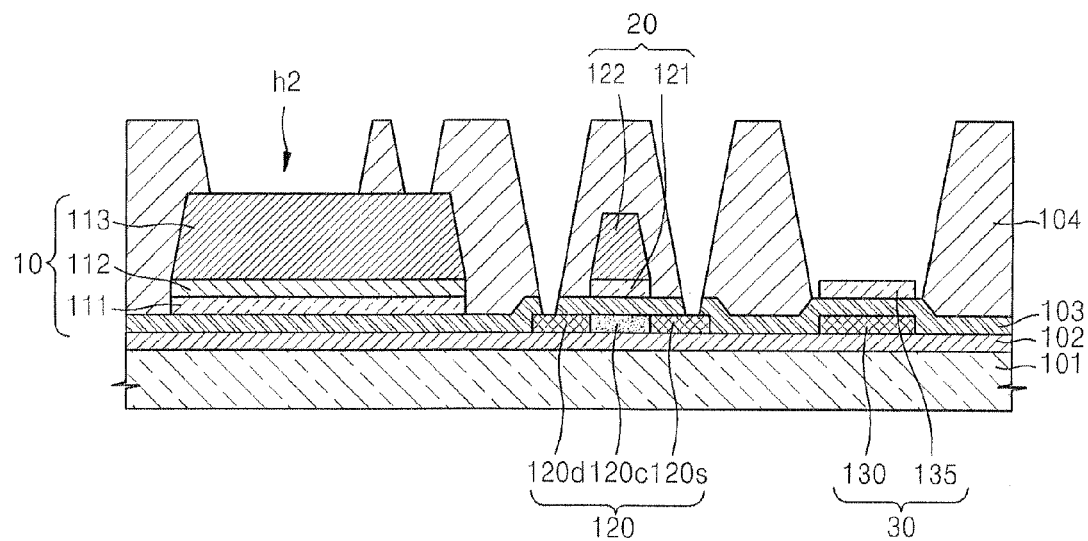

Referring to FIG. 6, the second insulation layers 104, as planarization films, are formed to cover the gate electrode 20, the pixel electrode 10, and the capacitor upper electrode 135. Also, contact holes are formed in the second insulation layers 104. The source area 120s and the drain area 120d of the active layer 120 are exposed through the contact holes formed in the second insulation layers 104. In order to form the contact holes, photolithography may be used. Also, the second opening h2 is formed in the second insulation layer 104. The third electrode layer 113 of the pixel electrode 10 is exposed through the second opening h2. Also, a hole is further formed in the second insulation layer 104 so as to expose the third electrode layer 113 of the pixel electrode 10 for later connection of the source/drain electrodes 126 to the pixel electrode 10. In addition, an opening is further formed in the second insulation layer 104 so as to expose the capacitor upper electrode 135.

Figure 7:
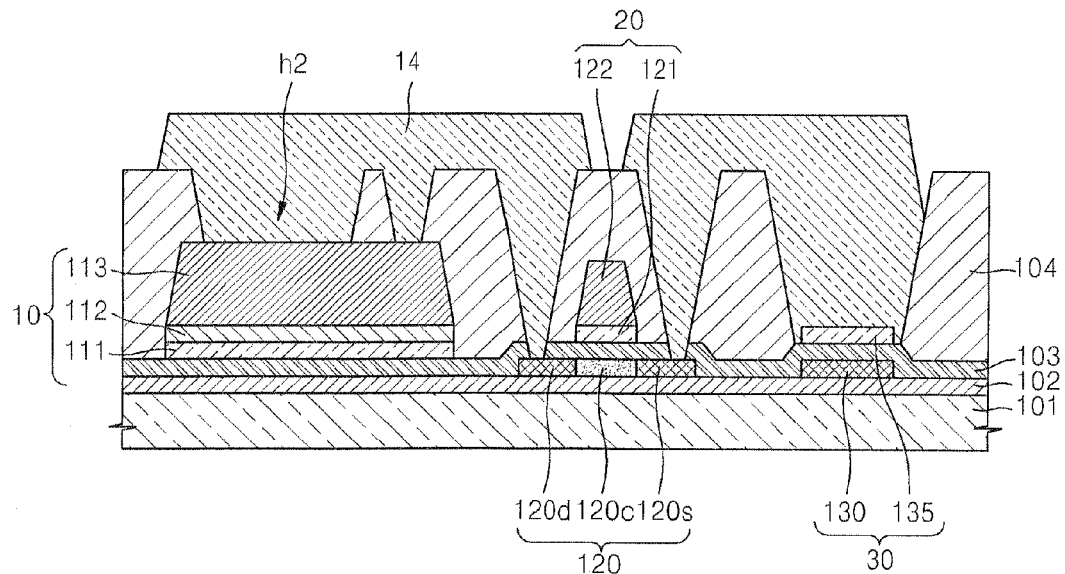

Referring to FIG. 7, a second metal layer 14 is further formed on the second insulation layers 104 in which the opening, hole, and contact holes are formed.

Figure 8:
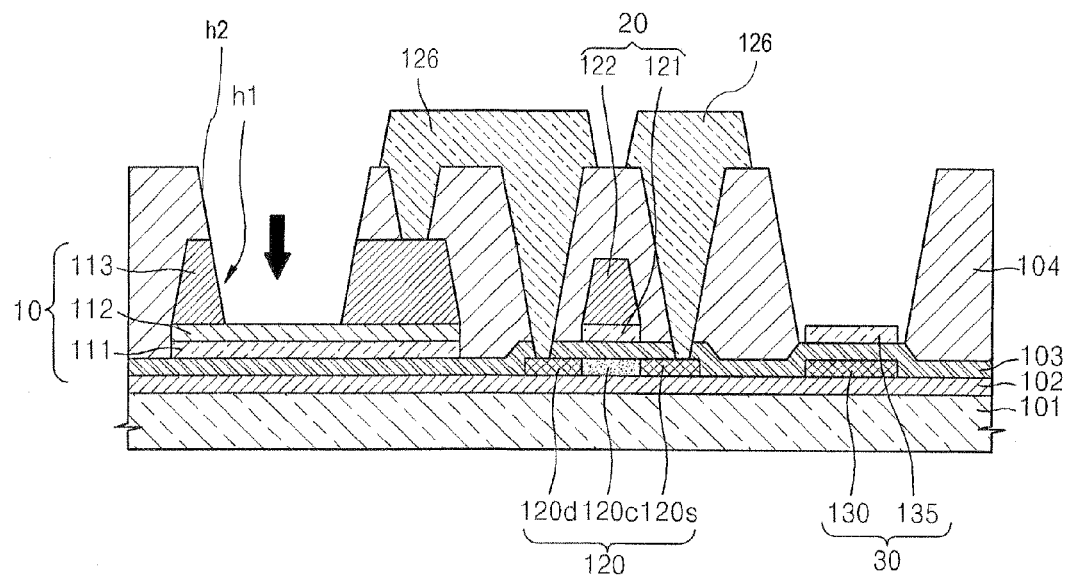

Referring to FIG. 8, the second metal layer 14 is patterned to form the source/drain electrodes 126. The source/drain electrodes 126 respectively contact the source area 120s and the drain area 120d of the active layer 120. Any one of the source/drain electrodes 126 contacts the pixel electrode 10, more specifically, the third electrode layer 113 of the pixel electrode 10. The source/drain electrodes 126 may be formed of various conductive layers and may have a multi-layer structure.

The first opening h1 that exposes the second electrode layer 112 is formed by etching the third electrode layer 113 of the pixel electrode 10 at the same time as the source/drain electrodes 126.

Figure 9:
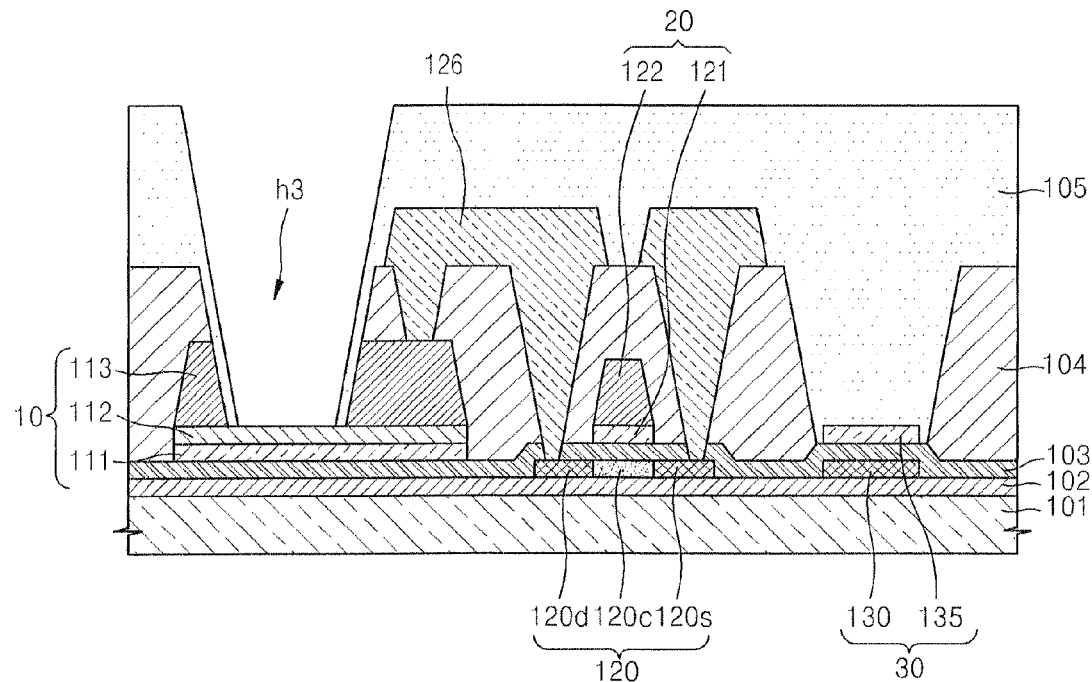

Referring to FIG. 9, the pixel-defining layer 105 is formed on the source/drain electrodes 126 and the pixel electrode 10. The pixel-defining layer 105 may include an organic material. The third opening h3 is formed in the pixel-defining layer 105 so as to expose the second electrode layer 112 of the pixel electrode 10. The third opening h3 connects to the first opening h1 and the second opening h2 or may be formed corresponding to the first opening h1 and the second opening h2.

Figure 10:
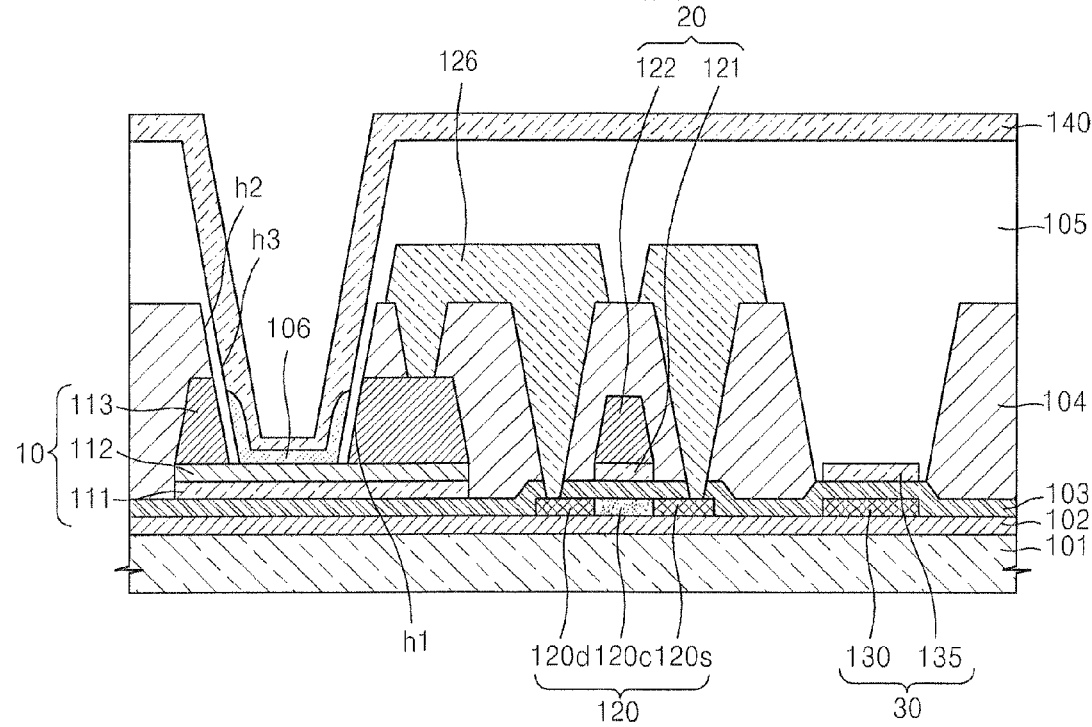

Referring to FIG. 10, the EL layer 106 and the opposite electrode 140 are sequentially formed on the second electrode layer 112 of the pixel electrode 10 exposed by the third opening h3 of the pixel-defining layer 105. The opposite electrode 140 covers the EL layer 106 and the pixel-defining layer 105. The EL layer 106 includes an emission layer. Materials used to form the EL layer 106 and the opposite electrode 140 are described above and thus detailed description thereof is omitted. Although not illustrated, the sealing member (not illustrated) may be formed on the opposite electrode 140 so as to face one surface of the substrate 101.

According to an embodiment of the present invention, the EL layer 106 may directly contact the semi-permeable second electrode layer 112 that realizes an optical resonance structure. Accordingly, light emitted from the EL layer 106 is directly applied to the semi-permeable second electrode layer 112. Since the second electrode layer 112 includes the pores p, light scattering efficiency of the second electrode layer 112 is improved. Also, since the second electrode layer 112 includes the pores p, light transmittance of the second electrode layer 112 is improved. Accordingly, the organic light-emitting display apparatus according to the embodiment of the present invention may have excellent optical extraction efficiency.

Figure 11:
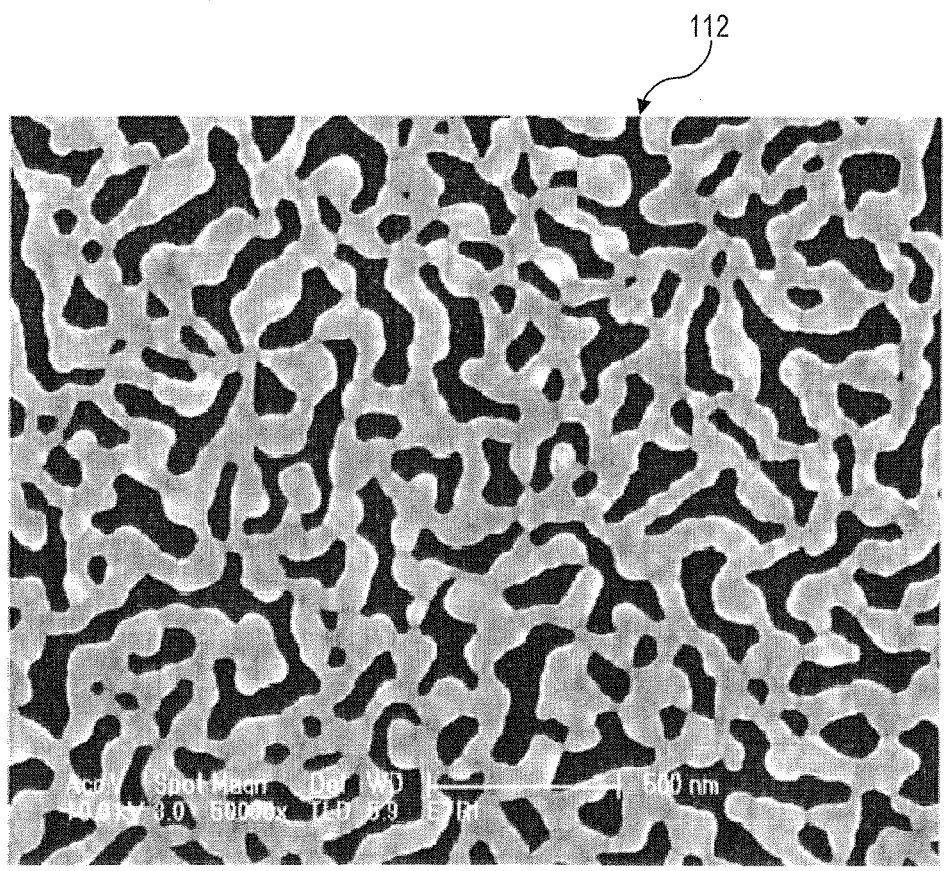
FIG. 11 is an image of a second electrode layer of a pixel electrode observed using a microscope.

FIG. 11 is an image of the second electrode layer 112 of the pixel electrode 10 observed using a microscope.

Referring to FIG. 11, the second electrode layer 112 is formed of a semi-permeable metal including pores. The second electrode layer 112 is formed by supplying, using inkjet printing, a liquefied material obtained by mixing a volatile solvent with nano-sized silver (Ag) particles. Accordingly, the pores are generated while evaporating the volatile solvent.

Figure 12:
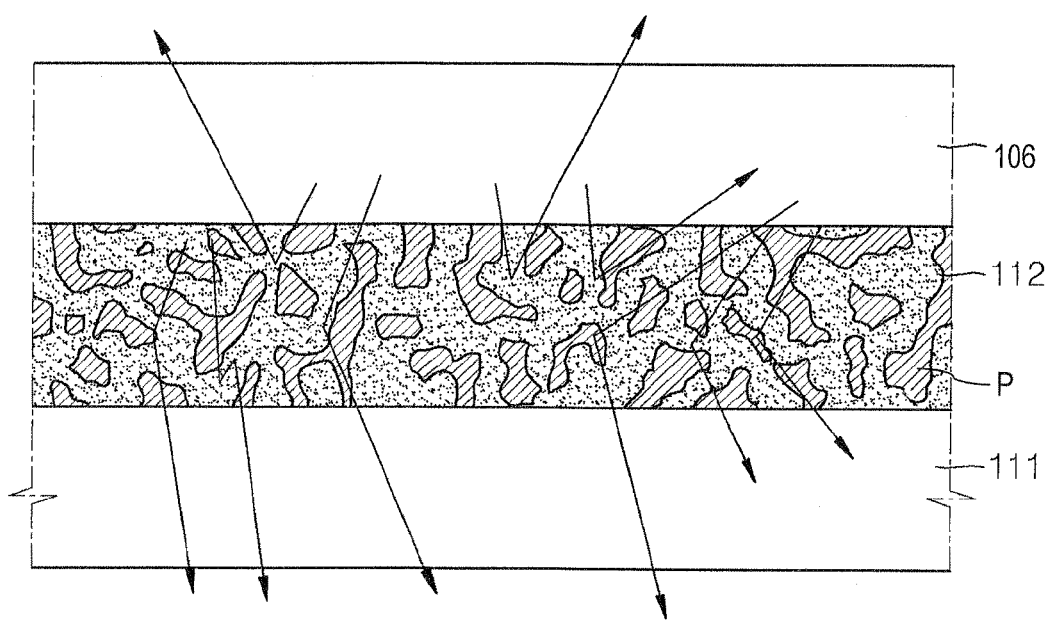
FIG. 12 is a diagram illustrating improvement in optical extraction efficiency by pores structure of a second electrode layer.

FIG. 12 is a diagram illustrating improvement in optical extraction efficiency by the pores p structure of the second electrode layer 112.

In general, most light emitted from the EL layer 106 may not be emitted to the outside. However, referring to FIG. 12, the second electrode layer 112 including the pores p is included in the pixel electrode 10 so that a geometric optical path is changed and light emitted from the EL layer 106 may be emitted to the outside by scattering.

Figure 13A:
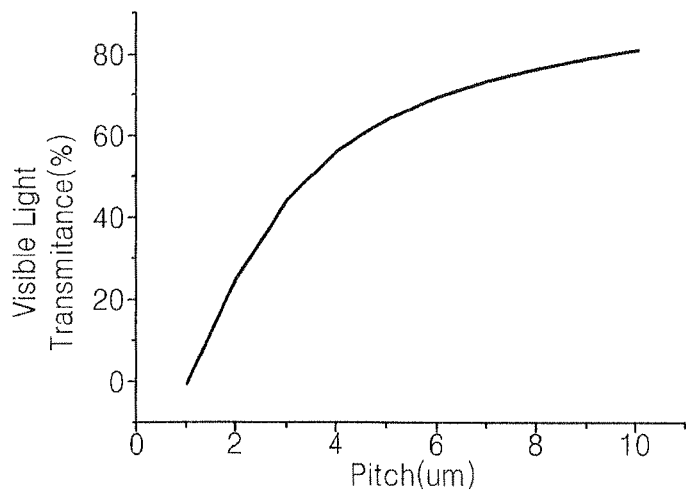
FIGS. 13A through 13C are graphs illustrating light transmittance by pores of a second electrode layer.
Figure 13B:
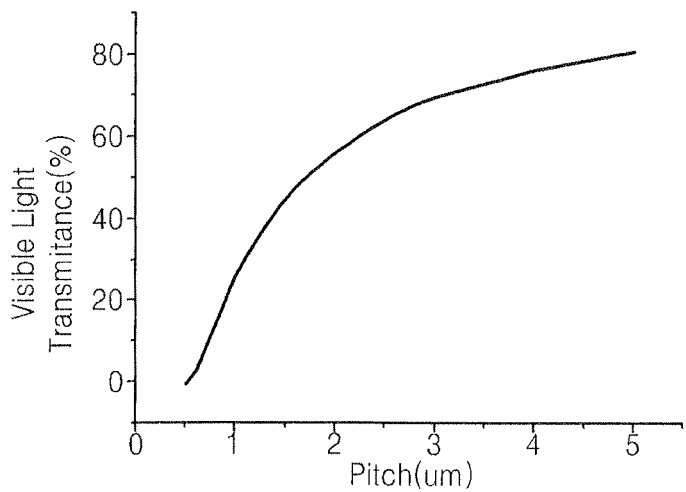
Figure 13C:
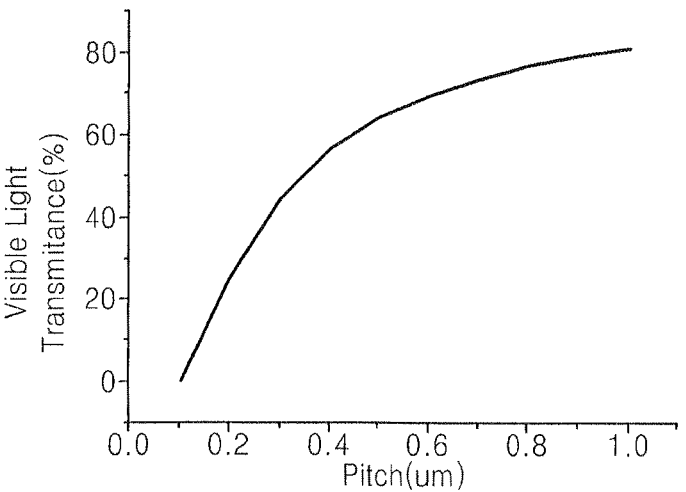

FIGS. 13A through 13C are graphs illustrating light transmittance by the pores p of the second electrode layer 112.

FIGS. 13A through 13C illustrate simulation results in which the pores p are assumed to have a mesh form. For example, it is assumed that silver (Ag) particles exist in a line form having a line width and silver particle lines cross in a perpendicular and horizontal direction. The relationship between the degree that an interval (that is, a pitch) between the silver particle lines extends and visible light transmittance is as follows.

In FIG. 13A, when a line width of the silver particle lines is 1 um, transmittance linearly increases until a pitch corresponds to about four times the line width.

In FIG. 13B, when a line width of the silver particle lines is 0.5 um, transmittance linearly increases until a pitch corresponds to about four times the line width.

In FIG. 13C, when a line width of the silver particle lines is 0.1 um, transmittance linearly increases until a pitch corresponds to about four times the line width.

According to the experiment results, as the pores p increase, light transmittance linearly increases until a certain level. Accordingly, the second electrode layer 112 including the pores p has higher transmittance than an electrode layer without the pores p. That is, the second electrode layer 112 including the pores p may function as a metal mirror and may efficiently emit light to the outside.

According to the embodiment of the present invention, the pixel electrode 10 is formed to have a multi-layer structure and includes the second electrode layer 112 functioning as a metal mirror that partially transmits or reflects light. In particular, since the second electrode layer 112 includes the pores p, a geometric optical path may be changed. Also, light transmittance increases due to the pores p. Finally, the second electrode layer 112 may efficiently extract light emitted from the EL layer 106 to the outside and thus optical extraction efficiency may increase.

In the embodiment of the present invention described with reference to FIGS. 1 through 10, only one thin film transistor and one capacitor are illustrated for convenience of description. However, the present invention is not limited thereto, and a plurality of thin film transistors and capacitors may be included as long as mask processes do not increase.

According to the embodiments of the present invention, a functional layer included in the pixel electrode to realize an optical resonance structure is formed of a metal having pores. Thus, light scattering easily occurs and a separate polarizer is not required. Also, since the functional layer included in the pixel electrode includes pores, light transmittance of the functional layer is excellent and thus optical extraction efficiency of the functional layer is improved.

Also, the functional layer that realizes an optical resonance structure is formed only in the pixel electrode by using printing and thus a separate patterning process is not required. Accordingly, a manufacturing process may be simplified and a manufacturing cost may be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting display apparatus comprising:
    an active layer formed on a substrate;
    a first insulation layer formed on the active layer;
    a gate electrode, separated from the active layer by the first insulation layer, the gate electrode having, in stacked sequence, a first conductive layer formed on the first insulation layer, and comprising a transparent conductive material, and a second conductive layer comprising a metal;
    a pixel electrode having, in stacked sequence, a first electrode layer, comprising a transparent conductive material, formed on the first insulation layer and spaced apart from the gate electrode, a second electrode layer formed of a semi-permeable metal comprising pores and nano-sized silver (Ag) particles, and a third electrode layer comprising a metal;
    a second insulation layer formed on the gate electrode and the pixel electrode;
    source/drain electrodes electrically connected to the active layer via the second insulation layer;
    an electro-luminescence (EL) layer formed on the second electrode layer of the pixel electrode; and
    an opposite electrode formed on the EL layer to face the pixel electrode.

2. The organic light-emitting display apparatus of claim 1, wherein the second electrode layer is formed by using inkjet printing.

3. The organic light-emitting display apparatus of claim 1, wherein the first electrode layer and the first conductive layer are formed at the same time.

4. The organic light-emitting display apparatus of claim 1, wherein the first conductive layer and the first electrode layer each comprise at least one material selected from a group consisting of indium tin oxide (ITO), indium zinc oxide (IZO), zinc oxide (ZnO), indium oxide ($In_2O_3$), indium gallium oxide (IGO), and aluminum zinc oxide (AZO).

5. The organic light-emitting display apparatus of claim 1, wherein the second conductive layer and the third electrode layer each comprise at least one metal selected from a group consisting of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu).

6. The organic light-emitting display apparatus of claim 1, wherein the second electrode layer contacts the EL layer.

7. The organic light-emitting display apparatus of claim 1, wherein the third electrode layer is electrically connected to any one of the source/drain electrodes via the second insulation layer.

8. The organic light-emitting display apparatus of claim 1, wherein the third electrode layer comprises a first opening so as to expose the second electrode layer disposed below the third electrode layer.

9. The organic light-emitting display apparatus of claim 8, wherein the second insulation layer comprises a second opening that corresponds to the first opening.

10. The organic light-emitting display apparatus of claim 9, further comprising a pixel-defining layer formed on the source/drain electrodes, wherein the pixel-defining layer comprises a third opening that connects to the first opening and the second opening or is formed corresponding to the first opening and the second opening, and the EL layer contacts the second electrode layer through the third opening.

11. The organic light-emitting display apparatus of claim 1, further comprising:
    a capacitor lower electrode formed on the substrate at the same level as the active layer and spaced apart from the active layer; and
    a capacitor upper electrode insulated from the capacitor lower electrode by the first insulation layer and formed on the same level as the gate electrode to correspond to the capacitor lower electrode.

12. The organic light-emitting display apparatus of claim 11, wherein the capacitor upper electrode is formed on the first insulation layer and comprises a transparent conductive material.

13. A method of manufacturing an organic light-emitting display apparatus, the method comprising:
    forming an active layer on the substrate;
    forming a first insulation layer on the active layer and the substrate;
    forming a pixel electrode and a gate electrode by sequentially forming a first transparent conductive layer, and a first metal layer on the first insulation layer and by patterning the first transparent conductive layer and the first metal layer, the process of forming the pixel electrode further comprising:
    inkjet printing a semi-permeable metal layer on the first transparent conductive layer
    prior to forming the first metal layer, the semi-permeable metal layer comprising nano-sized silver (Ag) particles and pores;
    forming a second insulation layer on the pixel electrode and the gate electrode;
    forming, by patterning the second insulation layer, an opening that exposes a portion of the pixel electrode, a first contact hole that exposes another portion of the pixel electrode and second and third contact holes that expose portions of the active layer;
    forming a second metal layer on the second insulation layer, the second metal layer contacting the active layer through the second and third contact holes and contacting the pixel electrode through the opening and the first contact hole;

patterning the second metal layer to form source and drain electrodes, while removing, via the opening, a portion of the second metal layer and a portion the first metal layer of the pixel electrode;

forming a pixel-defining layer on the source and drain electrodes and the pixel electrode; and exposing the pixel electrode by patterning the pixel-defining layer.

14. The method of claim 13, further comprising forming, after exposing the pixel electrode by patterning the pixel-defining layer, an electro-luminescence (EL) layer on the exposed pixel electrode and forming an opposite electrode to cover the EL layer.

15. The method of claim 14, wherein the process of patterning the second metal layer to form source and drain electrodes, while removing, via the opening, a portion of the second metal layer and a portion the first metal layer of the pixel electrode comprises:

exposing the semi-permeable metal layer, wherein the EL layer directly contacts the exposed semi-permeable metal layer.

16. The method of claim 13, wherein any one of the source and drain electrodes is electrically connected to the pixel electrode.

17. The method of claim 13, wherein the forming of the active layer on the substrate further comprises:

forming a capacitor lower electrode on the same level as the active layer to be spaced apart from the active layer.

18. The method of claim 17, wherein the process of patterning the first transparent conductive layer and the first metal layer, when the forming of the pixel electrode and the gate electrode, further comprises:

forming a capacitor upper electrode to correspond to the capacitor lower electrode.

* * * * *